US008661172B2

(12) United States Patent
Christensen et al.

(10) Patent No.: US 8,661,172 B2
(45) Date of Patent: Feb. 25, 2014

(54) CHANGEABLE FUNCTIONALITY IN A BROADCAST ROUTER

(75) Inventors: Carl Christensen, South Jordan, UT (US); Lynn Howard Arbuckle, Bountiful, UT (US)

(73) Assignee: GVBB Holdings S.A.R.L., Luxembourg (LU)

( * ) Notice: Subject to any disclaimer, the term of this patent is extended or adjusted under 35 U.S.C. 154(b) by 727 days.

(21) Appl. No.: 10/568,046

(22) PCT Filed: Mar. 2, 2004

(86) PCT No.: PCT/US2004/006357

§ 371 (c)(1), (2), (4) Date: Feb. 10, 2006

(87) PCT Pub. No.: WO2005/020514

PCT Pub. Date: Mar. 3, 2005

(65) Prior Publication Data

US 2008/0155155 A1 Jun. 26, 2008

Related U.S. Application Data

(60) Provisional application No. 60/495,656, filed on Aug. 15, 2003.

(51) Int. Cl.
*G06F 13/00* (2006.01)

(52) U.S. Cl.
USPC .............................. 710/104; 710/316; 710/10

(58) Field of Classification Search
USPC ............ 710/104, 307, 316, 317, 10; 370/230, 370/235
See application file for complete search history.

(56) References Cited

U.S. PATENT DOCUMENTS 4,764,959 A * 8/1988 Watanabe et al. ............. 713/187
5,465,106 A 11/1995 Keech et al.
5,502,718 A * 3/1996 Lane et al. .................... 370/414
5,530,813 A * 6/1996 Paulsen et al. ................ 710/317

(Continued)

FOREIGN PATENT DOCUMENTS

JP 08-213994 8/1996
JP 2001-308852 11/2001

(Continued)

OTHER PUBLICATIONS

Thinklogical. VX40, VX80, VX160, VX320 and VX320 Video. Product Manual. Jun. 2011.*

(Continued)

*Primary Examiner* — Matthew D Spittle
(74) *Attorney, Agent, or Firm* — Arent Fox LLP

(57) ABSTRACT

There is provided a broadcast router that includes a plurality of input cards, a plurality of output cards, at least one programmable device, and a configuration control card. The plurality of input cards input data into the broadcast router. The plurality of output cards output the data from the broadcast router. The configuration control card stores configuration information for configuring the at least one programmable device to perform a first set of functions. The configuration control card is adapted for removal and replacement by at least one other configuration control card that stores other configuration information for configuring the at least one programmable device to perform a second set of functions having a difference from the first set of functions so as to change a functionality of the broadcast router.

4 Claims, 3 Drawing Sheets

401 INPUT CARD 410 415 466 EXPANSION CARD PROGRAMMABLE DEVICE
EXPANSION CARD
CONFIGURATION CONTROL CARD 495 496A 496B
CONTROL CARD 499 450 MATRIX CARD 465 OUTPUT CARD 460

(56) References Cited

U.S. PATENT DOCUMENTS

| | | | | |
|---|---|---|---|---|
| 5,550,815 | A | 8/1996 | Cloonan et al. | |
| 5,625,780 | A * | 4/1997 | Hsieh et al. | 710/316 |
| 5,628,028 | A | 5/1997 | Michelson | |
| 5,682,533 | A | 10/1997 | Siljestroemer | |
| 5,727,002 | A | 3/1998 | Miller et al. | |
| 5,754,785 | A | 5/1998 | Lysik et al. | |
| 5,802,290 | A | 9/1998 | Casselman | |
| 5,819,050 | A | 10/1998 | Boehling | |
| 5,875,310 | A | 2/1999 | Buckland et al. | |
| 6,078,953 | A | 6/2000 | Vaid et al. | |
| 6,094,525 | A | 7/2000 | Perlman et al. | |
| 6,101,565 | A * | 8/2000 | Nishtala et al. | 710/307 |
| 6,230,217 | B1 * | 5/2001 | Tuccio et al. | 710/8 |
| 6,240,463 | B1 | 5/2001 | Benmohamed et al. | |
| 6,459,699 | B1 | 10/2002 | Kimura et al. | |
| 6,535,924 | B1 * | 3/2003 | Kwok et al. | 709/242 |
| 6,599,134 | B1 | 7/2003 | Duarte et al. | |
| 6,807,167 | B1 | 10/2004 | Chakrabarti et al. | |
| 7,023,840 | B2 * | 4/2006 | Golla et al. | 370/360 |
| 7,136,957 | B2 * | 11/2006 | Somervill et al. | 710/316 |
| 7,254,112 | B2 * | 8/2007 | Cornet et al. | 370/230 |
| 7,805,766 | B2 * | 9/2010 | Christensen et al. | 726/34 |
| 2003/0200330 | A1 | 10/2003 | Oelke et al. | |

FOREIGN PATENT DOCUMENTS

| | | | |
|---|---|---|---|
| JP | 2002-374248 | | 12/2002 |
| WO | 9618146 | A1 | 6/1996 |
| WO | 9804067 | A1 | 1/1998 |
| WO | WO 00/72528 | A | 11/2000 |
| WO | WO 01/06798 | A | 1/2001 |
| WO | WO 03/021465 | A | 3/2003 |

OTHER PUBLICATIONS

Cisco. Cisco 10000 Series Router Line Card. Configuraiton Guide. Nov. 2009.*

HeiTel Digital Video. TDT C1500 Router Configuration. Technical Product Information No. 10.02. 2010.*

Search Report dtd. Sep. 24, 2004.

Ambar, Sidarth et al. Dynamic Router Configuration Management for Wireless Mobile Environments. Abstract XP-002123908. pp. 31-34.

Akito Yuasa, "How to Update Driver and Firmware," Gekkan ASCII PC, ASCII Corporation, May 1, 2003, vol. 6, No. 5, pp. 62 to 69.

Office Action in Canadian Patent Application No. 2,535,558 dated Dec. 2, 2011.

Office Action in Canadian Patent Application No. 2,535,558 dated Jul. 24, 2012.

* cited by examiner

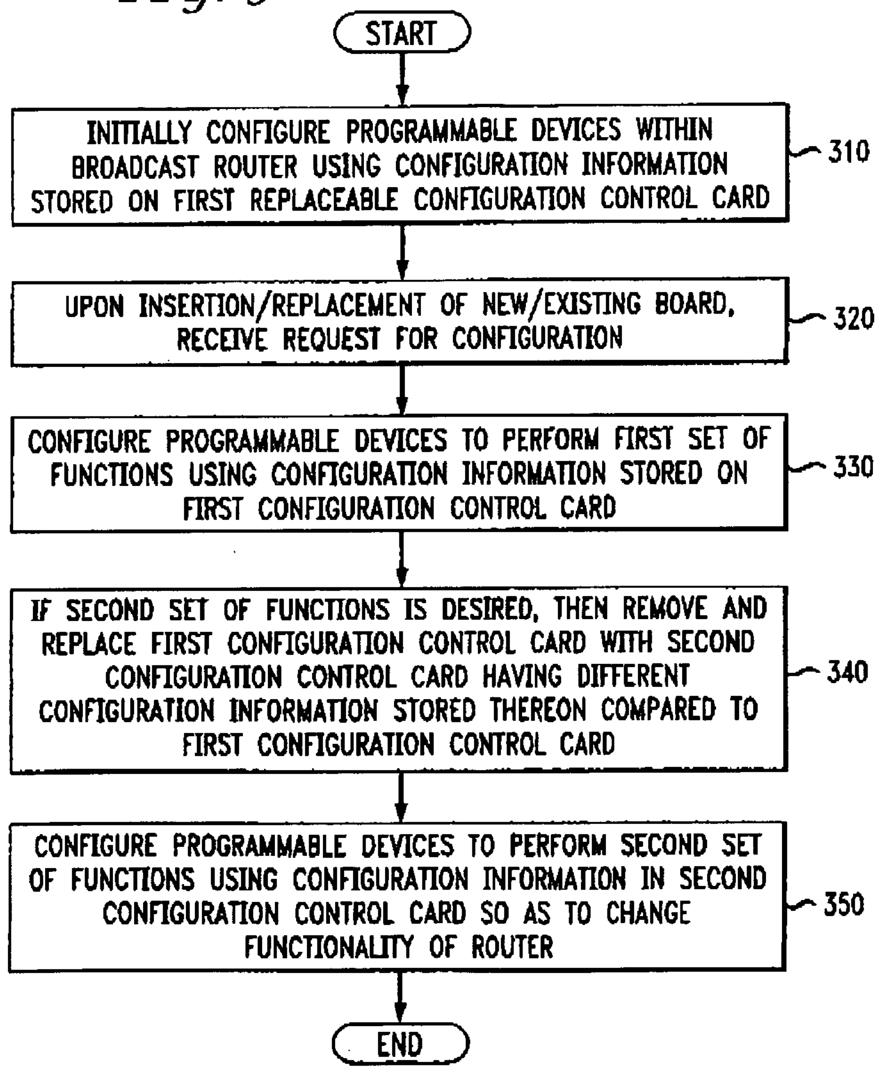
FIG. 3
START
INITIALLY CONFIGURE PROGRAMMABLE DEVICES WITHIN BROADCAST ROUTER USING CONFIGURATION INFORMATION STORED ON FIRST REPLACEABLE CONFIGURATION CONTROL CARD
310
UPON INSERTION/REPLACEMENT OF NEW/EXISTING BOARD, RECEIVE REQUEST FOR CONFIGURATION
320
CONFIGURE PROGRAMMABLE DEVICES TO PERFORM FIRST SET OF FUNCTIONS USING CONFIGURATION INFORMATION STORED ON FIRST CONFIGURATION CONTROL CARD
330
IF SECOND SET OF FUNCTIONS IS DESIRED, THEN REMOVE AND REPLACE FIRST CONFIGURATION CONTROL CARD WITH SECOND CONFIGURATION CONTROL CARD HAVING DIFFERENT CONFIGURATION INFORMATION STORED THEREON COMPARED TO FIRST CONFIGURATION CONTROL CARD
340
CONFIGURE PROGRAMMABLE DEVICES TO PERFORM SECOND SET OF FUNCTIONS USING CONFIGURATION INFORMATION IN SECOND CONFIGURATION CONTROL CARD SO AS TO CHANGE FUNCTIONALITY OF ROUTER
350
END

CHANGEABLE FUNCTIONALITY IN A BROADCAST ROUTER

This present application claims priority to US Provisional Application No. 60/495,656, filed Aug. 15, 2013.

BACKGROUND OF THE INVENTION

1. Field of the Invention

The present invention generally relates to routers and, more particularly, to changeable functionality in a broadcast router.

2. Background of the Invention

A broadcast router allows each one of a plurality of outputs there from to be assigned a signal from any one of a plurality of inputs thereto. For example, an N×M broadcast router has N inputs and M outputs coupled together by a routing engine that allows any one of the N inputs to be applied to each one of the M outputs.

Generally, a more expensive router is expected to have greater functionality than a less expensive router. Accordingly, different router models have different hardware configurations, thereby adding to both manufacturing and maintenance costs.

Conventionally, upgrades to broadcast routers have been implemented by replacing one or more of the main components or downloading new software to the router. Replacement of main components is costly, and the process of downloading new software is considered a reliability risk.

Accordingly, it would be desirable and highly advantageous to have a broadcast router capable of having its functionality readily changed so as to provide different configurations or levels of operational sophistication in a manner that overcomes the above-described deficiencies of the prior art. Such a broadcast router should advantageously be capable of providing different router models with common hardware arrangements.

SUMMARY OF THE INVENTION

The problems stated above, as well as other related problems of the prior art, are solved by the present invention, which is directed to changeable functionality in broadcast routers.

According to an aspect of the present invention, there is provided a broadcast router that includes a plurality of input cards, a plurality of output cards, at least one programmable device, and a configuration control card. The plurality of input cards input data into the broadcast router. The plurality of output cards output the data from the broadcast router. The configuration control card stores configuration information for configuring the at least one programmable device to perform a first set of functions. The configuration control card is adapted for removal and replacement by at least one other configuration control card that stores other configuration information for configuring the at least one programmable device to perform a second set of functions having a difference from the first set of functions so as to change a functionality of the broadcast router.

According to another aspect of the present invention, there is provided a method for changing a functionality of a broadcast router that has a plurality of input cards, a plurality of outputs cards, and at least one programmable device. The method includes the step of providing a replaceable configuration control card for insertion into the broadcast router and for storing configuration information for configuring the at least one programmable device to perform a first set of functions. The configuration control card is adapted for removal and replacement by at least one other configuration control card that stores other configuration information for configuring the at least one programmable device to perform a second set of functions having a difference from the first set of functions so as to change a functionality of the broadcast router.

According to yet another aspect of the present invention, there is provided a broadcast router that includes a plurality of input cards, an expansion card, a matrix card, a plurality of output cards, at least one programmable device, and a configuration control card. The plurality of input cards receives data into the broadcast router. The expansion card receives the data from the plurality of input cards and arranging the data for transfer within the broadcast router. The matrix card receives the data from the plurality of input cards for subsequent routing within the broadcast router. The plurality of output cards receives the data from the matrix card and output the data from the broadcast router. The configuration control card stores configuration information for configuring the at least one programmable device to perform a first set of functions. The configuration control card is adapted for removal and replacement by at least one other configuration control card that stores other configuration information for configuring the at least one programmable device to perform a second set of functions having a difference from the first set of functions so as to change a functionality of the broadcast router.

These and other aspects, features and advantages of the present invention will become apparent from the following detailed description of preferred embodiments, which is to be read in connection with the accompanying drawings.

BRIEF DESCRIPTION OF THE DRAWINGS

FIG. 3 is a flow diagram illustrating a method for readily changing the functionality of a broadcast router, according to an illustrative embodiment of the present invention.

DETAILED DESCRIPTION OF THE INVENTION

Figure 1:
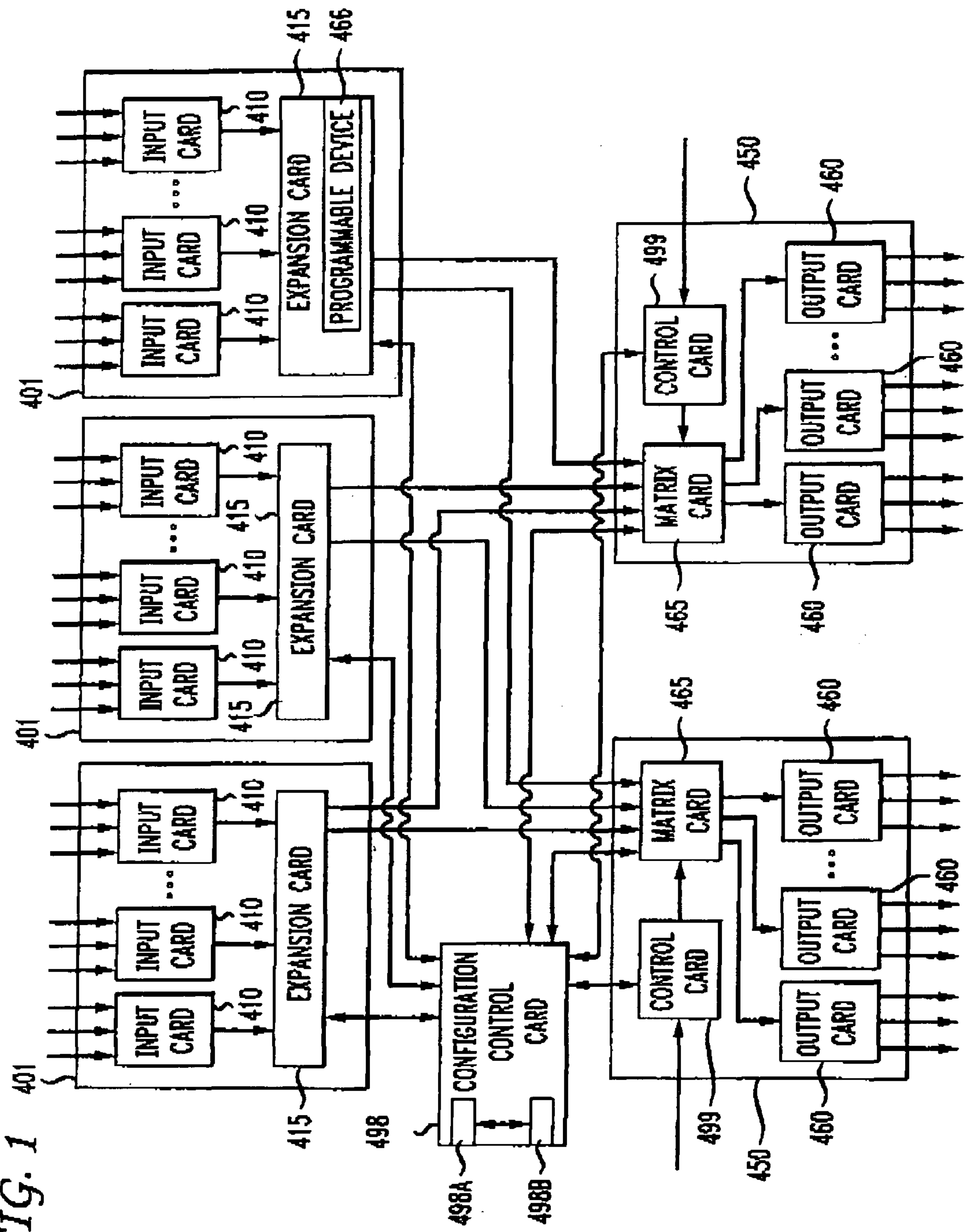
FIG. 1 is a block diagram illustrating a broadcast router 400, according to an illustrative embodiment of the present invention.

The present invention is directed to changeable functionality in a broadcast router. Advantageously, the present invention allows for a broadcast router to provide different configurations or levels of operational sophistication in a cost efficient and reliable manner while using common hardware arrangements. Such variable functionality is obtained by the use of readily changeable configuration information. The configuration information may be readily changed in accordance with the present invention by, for example, replacement of Programmable Read Only Memory PROM) content, module and/or circuit board replacement, and so forth.

According to an embodiment of the present invention, a configuration circuit, in communication with a configuration information repository is used to provide a selected and changeable level of functionality to a router. In the illustrative embodiment, the configuration circuit and configuration information repository are disposed on a removable configuration control card. The configuration information stored in the configuration information repository may be used to configure, for example, multiple Field Programmable Gate Arrays (FPGAs) or other custom Integrated Circuits (ICs) in the router to provide the selected and changeable level of functionality. On power-up or when a card (e.g., input card, output card, expansion card, matrix card, control card, and so forth) is inserted into the router, a request for configuration is generated. The card that is to be configured or some other entity within the router may generate the request. The configuration circuit recognizes the request and completes the configuration using the configuration information maintained in the configuration repository. The level of functionality of the broadcast router is controlled by the configuration circuit and the configuration information maintained in the configuration repository. Moreover, a user-operated switch (or switches) or other mechanism (or mechanisms) may be included on the configuration control card to allow a user to initiate a reconfiguration of one or more elements of the router, including a reconfiguration of the entire router.

For example, to upgrade a router from a first level of functionality in which the router is capable of performing a first set of functions to a second level of functionality in which the router is capable of performing a second set of functions, the configuration circuit used to configure the router is removed and replaced by a second configuration circuit having different configuration information maintained in its configuration repository. Such removal and replacement of the configuration circuit and its configuration information repository is facilitated by removal of the configuration control card. When the router issues a subsequent request for configuration, the information included in the second configuration circuit will be used to configure the router. In this manner, the broadcast router is configured at the second level of functionality that differs from the first level of functionality or sophistication, together with a memory (configuration information repository) that includes corresponding functionality configurations, thereby allowing the manufacturer to assemble standardized products with functionality determined by the memory. It is to be appreciated that the terms "board" and "card" are used interchangeably herein.

It is to be appreciated that while configuration information stored in the configuration information repository may be differ from one set of functions to the next, the configuration circuit may or may not differ, depending upon the level of sophistication of the configuration circuit itself. In the latter case (the configuration circuit does not differ from one configuration to the next, only the configuration information, then the use of a similar design for the configuration circuit further reduces costs associated therewith, thereby providing additional benefits readily appreciated by those of ordinary skill in the related art. Given the teachings of the present invention provided herein, these and other variations and implementation of the configuration circuit are readily contemplated by one of ordinary skill in the related art, all while maintaining the spirit of the present invention.

FIG. 1 is a block diagram illustrating a broadcast router 400, according to an illustrative embodiment of the present invention. The broadcast router 400 includes three input chassis 401 and two output chassis 450. It is to be appreciated while the broadcast router 400 of FIG. 1 is shown and described with respect to three input chassis and two output chassis, a broadcast router in accordance with the present invention may have number of input chassis and any number of output chassis including an equal number thereof, while maintaining the spirit of the present invention.

Each of the input chassis 401 includes a plurality of input cards (hereinafter "input cards") 410, an expansion card 415, and a configuration control card 498.

The input cards 410 receive input streams and "condition" the input streams for transmission through the broadcast router 400. The types of signal conditioning operations to be performed on the input stream will vary depending on the signal type to be conditioned. For example, some of the types of signal conditioning that may be employed include, but are not limited to, decoding, re-clocking, amplitude amplification, and so forth.

The expansion card 415 receives the streams from the input cards 410 and arranges the streams in time division multiplexed streams for transmission to the output chassis 450. It is to be appreciated that the present invention is not limited to time division multiplexing by the expansion card to arrange the streams and, thus, other data arranging schemes may also be employed while maintaining the spirit of the present invention.

Each of the output chassis 450 includes a plurality of output cards (hereinafter "output cards") 460, a matrix card 465, and a configuration control card 499.

The matrix card 465 receives the time-multiplexed streams from the input chassis and routes the streams to the appropriate output cards 460.

The output cards 460 receive the streams from the matrix card 465 and prepare the streams for transmission on the outputs of the broadcast router 400. Preparation of the streams may involve signal conditioning, conversation of the data within parameters of a pre-specified protocol, and so forth.

The configuration control card 498 includes a configuration circuit 498A for configuring one or more of the cards in the broadcast router and/or a memory device 498B that includes configuration information for use by one or more other cards that perform the actual configuration. The configuration of the individual cards may be performed by programmable devices 466 disposed on those cards, using the configuration information stored in memory device 498B of the configuration control card 498 or may be performed by the configuration circuit 498A of the configuration control card 498. Moreover, in either case, the configuration circuit 498A may process, condition, and so forth the configuration information stored in the memory device 498B of the configuration control card prior to use of the configuration information for configuring one or more cards of the router. Thus, in some embodiments of the present invention, the configuration circuit 498A (or configuration/programmable devices) may be located on a different card than the configuration control card 498, so that only configuration information need be stored in the configuration control card 498 (on memory device 498A) while still providing the benefit of readily changing the functionality of the broadcast router in accordance with the present invention. It is to be appreciated that while a programmable device 466 is shown in only one of the expansion cads 415 of the router 400 of FIG. 1, programmable devices as described herein may reside on any of the cards disposed within the router and may be employed for configuration purposes in accordance with the present invention.

Different versions of the configuration control card 498 allow for different capabilities of the broadcast router 400. The configuration control card 498 may be removed for short periods of time without any adverse consequences to allow for changes/upgrades to the broadcast router. It is to be appreciated that the cost and complexity of the configuration control card 498 is relatively small in comparison to the other elements of the broadcast router 400.

The configuration control card 498 may be implemented in a number of different ways to allow for changes/updates to be applied to the broadcast router 400. Some of the ways include, but are not limited to: storing configuration data for Field Programmable Gate Arrays (FPGAs) on the configuration control card 498; storing checksums and/or codes to enable and/or disable logic in FPGAs or other custom Integrated Circuits (ICs) included in the configuration control card 498 or in some other card(s) (e.g., control card 499, etc.); storing checksums and/or codes that enable and/or disable different functionality of CPU-based state machines within the broadcast router 400 (e.g., within the configuration control card 498 or some other card(s)); storing executable code that enable and/or disable different functionality of CPU-based systems within the broadcast router 400; and so forth. It is to be appreciated that any of the above implementations of the configuration control card 498 that involve the storage of data/checksums/codes may employ encryption and/or other security methodologies. It is to be further appreciated that enabling a function may be considered the same as adding a function, and disabling a function may be considered the same as removing a function.

The functionality that may be added/removed from the broadcast router 400 includes, but is not limited to, fading at the switch points, receiving alternate input streams, remote error monitoring, signal mixing, at least one of altering and enabling Digital Signal Processor (DSP) functions, metering, and modifying router size.

Regarding alternate input streams, audio examples of such include, but are not limited to, Multichannel Audio Digital Interface (MADI), Collection of Broadcasts from Remote Accesses (COBRA) Net, and so forth.

Regarding signal mixing, such mixing with respect to audio includes, but is not limited to, audio down mixing of surround sound and mono mixing of stereo pairs. Regarding signal mixing, such mixing with respect to video includes, but is not limited to, cross fades, key insertion, and so forth.

Regarding DSP functionality, such functionality includes, but is not limited to, color/focus enhancement, delay, audio equalization, and so forth.

Regarding metering, such metering may involve, but is not limited to, volume, signal strength, signal health, data errors, and so forth.

Regarding router size, changes thereto may involve, but are not limited to, the number of inputs, the number of outputs, and so forth.

While the configuration control card 498 is shown in FIG. 1 as being operatively connected to the expansion cards 415, the matrix cards 465, and the control cards 499, the configuration control card 498 may be operatively coupled to any card or entity within the broadcast router 400 that is to be configured.

It is to be appreciated that different versions of the configuration control card 498 may be provided based on corresponding licenses purchased by licensees. In this way, a licensor of the different versions of the configuration control card 498 may control which versions of the configuration control cards 498 may be used in a given broadcast router by a given licensee. The optional use of encryption of the configuration information provides a means to enforce license agreements by preventing unauthorized uses of various versions of the configuration control card 498.

In the illustrative embodiment of FIG. 1, a control card 499 is shown and described with respect to the output chassis 401. However, it is to be appreciated that the control card may be employed with respect to the input chassis 401 and/or the output chassis 450.

The control card 499 interfaces support protocols with the input chassis 401 (and/or the output chassis 450) for changing the input/output assignments of the broadcast router 400. It is to be appreciated that the functions performed by the control card 499 may be optionally subsumed by and integrated with the expansion card 415 and/or the matrix card 465, depending upon whether the control card 499 is implemented within the input chassis 401 and/or the output chassis 450, respectively.

For each input chassis 401, the input cards 410 of that input chassis 401 receive and decode a number of incoming input streams (hereinafter "data"), and then output the data to the expansion card 415. For each input chassis 401, the expansion card 415 of that input chassis 401 receives all of the data from all of the input cards 410 and transfers the data to all of the output chassis 450.

For each output chassis 450, the matrix card 465 receives the data from all of the input chassis 401 and routes the data to the output cards 460. The output cards 460 recreate the associated input stream that was input to the broadcast router 400 on the outputs of the broadcast router 400.

Figure 2:
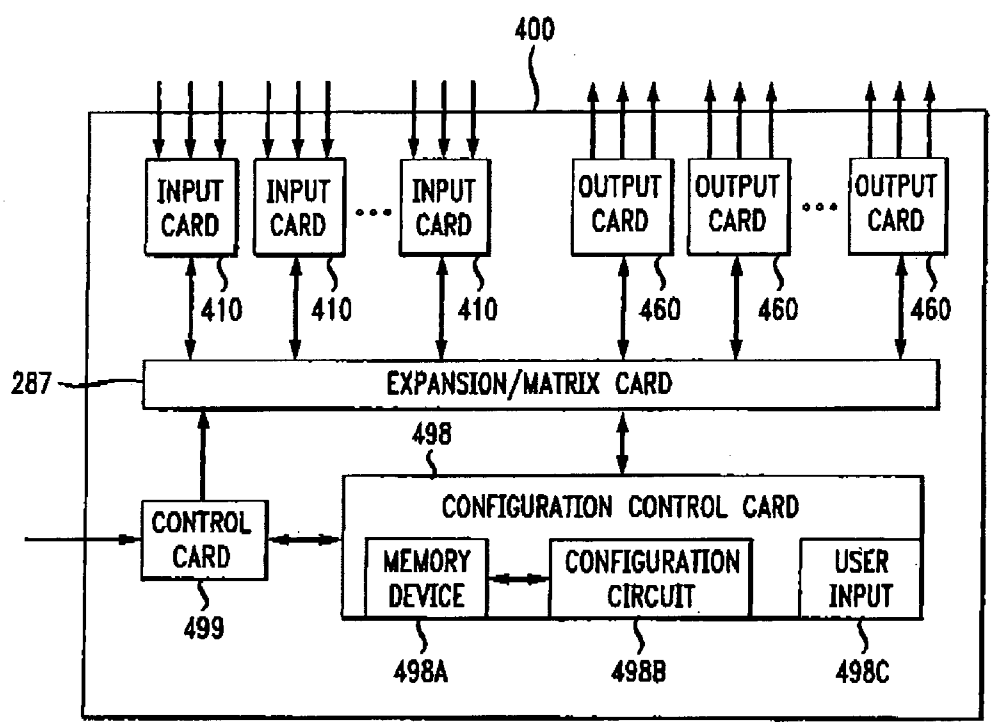
FIG. 2 is a block diagram illustrating a broadcast router 200, according to another illustrative embodiment of the present invention.

FIG. 2 is a block diagram illustrating a broadcast router 200, according to another illustrative embodiment of the present invention. The broadcast router 200 includes a single chassis 201. The broadcast router 200 includes input cards 410, outputs cards 460, an expansion/matrix card 287, a control card 499, and a configuration control card 498. The preceding elements of broadcast router 200 function similarly to the same named elements shown and described with respect to FIG. 1, with the exception that the expansion/matrix card 287 combines the functionalities of the expansion card 415 and the matrix card 465 shown and described with respect to FIG. 1. Moreover, the configuration control card 498 includes a user input device 498C for receiving a user input for initiating a configuration/reconfiguration of one or more elements of the broadcast router 200 including a configuration/reconfiguration of the entire router 200. The user input device 498C may be any type of user input device. In a simplified example, the user input device 498C may include one or more switches that are actuated by a user. It is to be appreciated that the terms configuring and reconfiguring (as well as variations thereof) are used interchangeably herein.

FIG. 3 is a flow diagram illustrating a method for readily changing the functionality of a broadcast router, according to an illustrative embodiment of the present invention.

The programmable devices residing within a broadcast router component are initially configured using the configuration information stored in the memory device on a first replaceable configuration control card that is inserted into the broadcast router (step 310). Such configuration may be initiated, for example, in response to the receipt of a user-provided input to the first replaceable configuration control card.

Upon the insertion of a new card or the replacement of an existing card, a request for configuration is received from that card (or some other entity monitoring the insertion/removal of cards in the router) (step 320).

The configuration information is used to program (configure) the devices to perform a first set of functions (step 330). It is to be appreciated that step 330 may involve decrypting, decoding or other manipulations and/or signal/data processing of the configuration information by the configuration circuit disposed on the first configuration control card.

If a second set of functions is desired, then the first configuration control card is removed and replaced with a second configuration control card (step 340). Like the first configuration control card, the second configuration control card has a memory device in which (other) configuration information for the programmable devices is maintained. The information maintained in the memory device of the second configuration control card differs from that maintained in the memory device of the first configuration control card.

When the programmable devices are subsequently configured, for example, during a subsequent power-up of the broadcast router, the configuration information maintained in the memory device of the second configuration control is used to program (configure) the devices to perform a second set of functions so as to change the functionality of the router (step 350). The configuration of the programmable devices using the configuration information stored in the second configuration control card provides the programmable devices of the broadcast router with a second level of functionality typically, a level of functionality greater than the broadcast router's initial level of functionality. In this manner, the devices of the broadcast router have been programmed to perform a second set of functions distinct from the first set of functions.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

The invention claimed is:

1. A broadcast router, comprising:

a plurality of input cards for inputting data into the broadcast router;

a plurality of output cards for outputting the data from the broadcast router;

at least one programmable device; and a configuration control card for storing configuration information for configuring the at least one programmable device to perform a first set of functions, wherein the configuration control card is configured for removal and replacement by at least one other configuration control card that stores other configuration information for configuring the at least one programmable device to perform a second set of functions having a difference from the first set of functions so as to change a functionality of the broadcast router, wherein each of the plurality of output cards comprise an additional configuration control card that receives the configuration information from the configuration control card and performs reconfiguration of the corresponding output card.

2. The broadcast router of claim 1, wherein each additional configuration control card comprises a programmable device disposed on the card.

3. A broadcast router, comprising:

a plurality of input cards for inputting data into the broadcast router;

a plurality of output cards for outputting the data from the broadcast router;

at least one programmable device; and a configuration control card for storing configuration information for configuring the at least one programmable device to perform a first set of functions, wherein the configuration control card is configured for removal and replacement by at least one other configuration control card that stores other configuration information for configuring the at least one programmable device to perform a second set of functions having a difference from the first set of functions so as to change a functionality of the broadcast router, wherein each of the plurality of input cards comprise an additional configuration control card that receives the configuration information from the configuration control card and performs reconfiguration of the corresponding output card.

4. A broadcast router, comprising:

a plurality of input cards for inputting data into the broadcast router;

a plurality of output cards for outputting the data from the broadcast router;

at least one programmable device; and a configuration control card for storing configuration information for configuring the at least one programmable device to perform a first set of functions, wherein the configuration control card is configured for removal and replacement by at least one other configuration control card that stores other configuration information for configuring the at least one programmable device to perform a second set of functions having a difference from the first set of functions so as to change a functionality of the broadcast router, wherein the broadcast router continues to function when the configuration control card is removed.

* * * * *